(12) United States Patent
Kinsley et al.

(10) Patent No.: US 11,589,480 B2
(45) Date of Patent: Feb. 21, 2023

(54) TUBULAR HEAT SPREADERS FOR MEMORY MODULES AND MEMORY MODULES INCORPORATING THE SAME

(71) Applicant: Micron Technology, Inc., Boise, ID (US)

(72) Inventors: Thomas H. Kinsley, Boise, ID (US); George E. Pax, Boise, ID (US); Yogesh Sharma, Boise, ID (US); Gregory A. King, Hastings, MN (US); Chan H. Yoo, Boise, ID (US); Randon K. Richards, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/523,750

(22) Filed: Nov. 10, 2021

(65) Prior Publication Data

US 2022/0071061 A1 Mar. 3, 2022

Related U.S. Application Data

(63) Continuation of application No. 16/530,792, filed on Aug. 2, 2019.

(51) Int. Cl.
*H05K 7/20* (2006.01)
*H01L 23/367* (2006.01)
*H01L 23/373* (2006.01)
*G06F 1/20* (2006.01)
*H01L 23/467* (2006.01)

(52) U.S. Cl.
CPC .......... *H05K 7/20509* (2013.01); *G06F 1/20* (2013.01); *H01L 23/3672* (2013.01); *H01L 23/373* (2013.01); *H01L 23/467* (2013.01); *H05K 7/20436* (2013.01); *G06F 2200/201* (2013.01)

(58) Field of Classification Search
None
See application file for complete search history.

(56) References Cited

U.S. PATENT DOCUMENTS

| | | | |
|---|---|---|---|
| 6,421,240 B1 * | 7/2002 | Patel | H05K 7/20763 174/15.1 |
| 6,657,864 B1 | 12/2003 | Dyckman et al. | |
| 7,023,701 B2 | 4/2006 | Stocken et al. | |
| 7,038,142 B2 | 5/2006 | Abe | |
| 7,933,125 B2 | 4/2011 | Wei et al. | |
| 8,385,069 B2 * | 2/2013 | Iyengar | G06F 1/20 361/679.52 |
| 9,245,820 B2 * | 1/2016 | Goldrian | H01L 23/473 |
| 9,775,263 B2 * | 9/2017 | Ross | H05K 7/1487 |
| 9,867,315 B2 * | 1/2018 | Berk | F28D 15/00 |
| 10,602,640 B1 | 3/2020 | Tsai et al. | |
| 2003/0136577 A1 | 7/2003 | Abe | |
| 2006/0104035 A1 * | 5/2006 | Vasoya | H05K 1/0207 257/E23.101 |
| 2006/0221573 A1 | 10/2006 | Li | |
| 2007/0215381 A1 | 9/2007 | Vasoya | |

(Continued)

*Primary Examiner* — Courtney L Smith
(74) *Attorney, Agent, or Firm* — Perkins Coie LLP

(57) ABSTRACT

Systems, apparatuses, and methods for thermal dissipation on or from an electronic device are described. An apparatus may have a printed circuit board (PCB) having an edge connector. At least one integrated circuit device may be disposed on a surface of the PCB. A tubular heat spreader may be disposed along an edge of the PCB opposite the edge connector.

20 Claims, 2 Drawing Sheets

(56) References Cited

U.S. PATENT DOCUMENTS

| | | | |
|---|---|---|---|
| 2008/0062652 A1* | 3/2008 | Lieberman | H01L 23/427 |
| | | | 361/715 |
| 2008/0084667 A1* | 4/2008 | Campbell | H05K 7/20736 |
| | | | 165/80.4 |
| 2009/0002951 A1* | 1/2009 | Legen | H01L 23/427 |
| | | | 165/104.33 |
| 2009/0135565 A1* | 5/2009 | Legen | G06F 1/20 |
| | | | 361/715 |
| 2009/0168374 A1 | 7/2009 | Clayton et al. | |
| 2013/0322081 A1 | 12/2013 | Pan et al. | |
| 2014/0002980 A1 | 1/2014 | Berk et al. | |
| 2016/0057854 A1 | 2/2016 | Schneider et al. | |
| 2016/0095201 A1 | 3/2016 | Min et al. | |
| 2016/0249445 A1 | 8/2016 | Min et al. | |
| 2020/0163253 A1 | 5/2020 | Lunsman et al. | |
| 2021/0005575 A1 | 1/2021 | Yoo et al. | |
| 2021/0037679 A1 | 2/2021 | Kinsley et al. | |

\* cited by examiner

TUBULAR HEAT SPREADERS FOR MEMORY MODULES AND MEMORY MODULES INCORPORATING THE SAME

CROSS-REFERENCE TO RELATED APPLICATION(S)

This application is a continuation of U.S. application Ser. No. 16/530,792, filed Aug. 2, 2019; which is incorporated herein by reference in its entirety.

TECHNICAL FIELD

The present disclosure generally relates to semiconductor memory modules, and more particularly relates to tubular heat spreaders for memory modules and memory modules incorporating the same.

BACKGROUND

Semiconductor memories are often provided in memory modules, such as dual in-line memory modules, for use in system applications. These modules share common physical form factors (e.g., dimensions, pin-outs, connector shapes), in accordance with industry standards. As memory devices are provided with greater capacities and faster performance, the amount of heat generated poses a challenge to memory module design. There exists a need to convey heat away from the memory devices (and other heat-generating components, such as registering clock drivers (RCD), other semiconductor devices, integrated circuit elements, etc.) to heat radiating structures which can be cooled by, e.g., forced air cooling. Because the dimensions of memory modules are limited by industry-standard specifications, such as JEDEC specifications for dual in-line memory modules (DIMMs such as DDR4 and DDR5 RDIMMs and LRDIMMs), the space available for such thermal structures is limited and the performance of the thermal management solutions is frequently unsatisfactory.

DETAILED DESCRIPTION

As discussed above, thermal management of memory modules poses challenges, particularly given the space constraints of industry standard module dimensions and the high heat generated by higher-capacity and higher-bandwidth memory devices. For example, a memory module may includes a printed circuit board (PCB) having an edge connector, a plurality of memory devices (e.g., DRAM devices), and a registering clock driver (RCD). To convey thermal energy away from the memory devices and RCD during operation, various thermally conductive structures may be provided. For example, a heat spreader may be disposed over the memory module. The heat spreader may comprise a metal or other thermally conductive structure configured to increase the surface area available to radiate heat/permit heat exchange with a cooling gas (e.g., over a surface area greater than that of the outer surfaces of the memory devices and other heat-generating components). The heat spreader can include planar elements interfacing with (e.g., in thermal contact with) an outer surface of the memory devices to transfer heat from the memory devices to the heat spreader, and an upper portion joining the planar elements. The heat spreader may be held on the memory module by a friction fit, thermal adhesive, or with other approaches known to those of skill in the art.

In many systems where space is at a premium (e.g., server racks), there may be very little clearance above the top of a memory module, leaving very little room for heat exchanging structures exposed to the flow of a cooling gas. Accordingly, the performance of conventional heat spreaders may be limited. Several embodiments of the present technology can provide improved thermal management of memory modules by providing a memory module with a reduced-height printed circuit board (PCB) and a tubular heat spreader opposite the edge connector of the module without exceeding a module height restriction imposed by an industry standard. For example, some embodiments of the present technology are directed to memory modules comprising a PCB having an edge connector; a plurality of memory devices disposed on a surface of the PCB; and a tubular heat spreader disposed along an edge of the PCB opposite the edge connector. Other embodiments of the present technology are directed to tubular heat spreaders for a memory module, comprising a tubular portion open at both ends thereof to permit the through flow of a cooling gas; and two planar elements extending in parallel away from the tubular portion and configured to provide a friction fit with the memory module, wherein each of the planar elements is configured to convey thermal energy from the memory module to the tubular portion.

Figure 1:
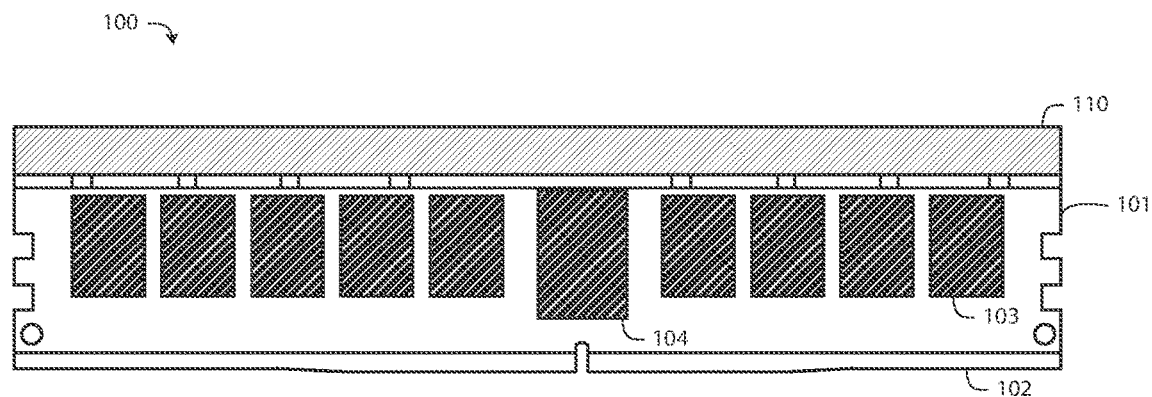
FIG. 1 is a simplified side view of a memory module including a tubular heat spreader in accordance with an embodiment of the present technology.
Figure 2A:
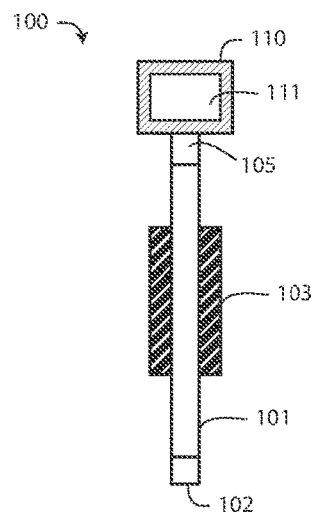
FIGS. 2A-2C are end views of memory modules including tubular heat spreaders in accordance with various embodiments of the present technology.

FIG. 1 is a simplified side view of a memory module including a tubular heat spreader in accordance with an embodiment of the present technology. The memory module 100 includes a PCB 101 having an edge connector 102, a plurality of memory devices 103 (e.g., DRAM devices), and an RCD 104. To provide more room for a tubular heat spreader 110, the PCB 101 can have a reduced height when compared to conventional memory modules. For example, in an embodiment where memory module 100 is a DDR4 RDIMM, rather than the 31 mm height of a conventional PCB, the PCB 101 may have a height of less than 27 mm to leave room for a tubular heat spreader 110 4 mm high. In other embodiments, tubular heat spreaders and memory modules with different dimensions may also be used (e.g., heat spreaders greater or less than 4 mm in height, and/or memory modules conforming to other industry standard specifications). The tubular heat spreader 110 is provided along an upper edge of the PCB 101 (e.g., opposite the edge connector 102) and is configured to provide efficient thermal exchange with a cooling gas directed along the major axis of the memory module 100. FIG. 2A illustrates an end view of memory module 100 in which it can be seen that the ends 111 of tubular heat spreader 110 are open, such that a cooling gas can pass through an inner portion of the tubular heat spreader 110.

In accordance with one embodiment of the present technology, the tubular heat spreader 110 can have a constant cross section (e.g., the rectilinear tubular cross section shown in FIG. 2A) as a result of formation by metal extrusion. Suitable metals for extruding a thermally conductive heat spreader can include copper, aluminum, silver, gold, alloys thereof, and the like. In other embodiments of the present technology, the tubular heat spreader 110 can be formed in other ways known to those of skill in the art (e.g., folding a planar metal structure, etc.).

Figure 2B:
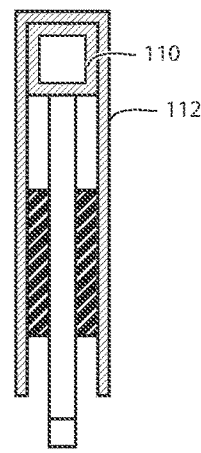

Although for ease of illustration in FIGS. 1 and 2A tubular heat spreader 110 is shown without a visible thermal connection to the memory devices 103 or RCD 104, in accordance with an aspect of the present technology, various approaches of providing a thermal connection between the tubular heat spreader 110 and the heat-generating components of the memory module may be employed. For example, FIG. 2B illustrates a memory module in an embodiment of the present technology in which a shroud 112 is provided surrounding the tubular portion 110 of tubular heat spreader 110 and extending to the memory devices on either side of the memory module. The shroud may comprise a metal or other thermally conductive material providing a thermal connection to both the tubular heat spreader 110 (e.g., the tubular portion thereof) and the heat-generating components of the memory module (e.g., the memory devices 103, the RCD 104, etc.). For example, the shroud may comprise a generally planar structure bent into a "U" cross-sectional shape, providing extensive thermal contact between an outer surface of the tubular portion of the tubular heat spreader 110 and the outermost planar surfaces of the heat-generating components. Alternatively, the cross-sectional shape of the shroud 112 may be provided by metal extrusion, or other metal manufacturing and forming techniques known to those of skill in the art. The shroud 112 may be attached to the memory module via a friction fit (e.g., with spring tension in the upper portion thereof providing the friction between the planar elements of the shroud 112 and the memory devices 103).

Figure 2C:
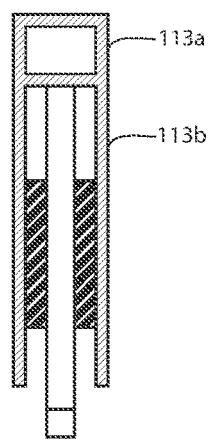

In an alternative embodiment, a tubular heat spreader may be provided with integrated planar elements for providing a thermal connection to heat-generating devices on a memory module. For example, FIG. 2C is an end view of a memory module 100 including a tubular heat spreader in accordance with an embodiment of the present technology. The tubular heat spreader comprises a tubular portion 113a (e.g., with a generally rectilinear cross-section and open ends) and integrated planar elements, such as planar element 113b, configured to provide a thermal path between the heat-generating elements of the memory module and the tubular portion 113a. In accordance with one aspect of the present technology, the cross-sectional shape of the tubular portion 113a and integrated planar elements 113b may be provided by metal extrusion, or other metal manufacturing and forming techniques known to those of skill in the art. In accordance with one aspect of the present technology, the integrated planar elements 113b may permit the attachment of the tubular heat spreader to the memory module via a friction fit. In other embodiments, the tubular heat spreader may be attached to the memory module in other ways (e.g., thermal adhesive between the planar elements 113b and the heat-generating components, solder connections 105, etc.).

Figure 3:
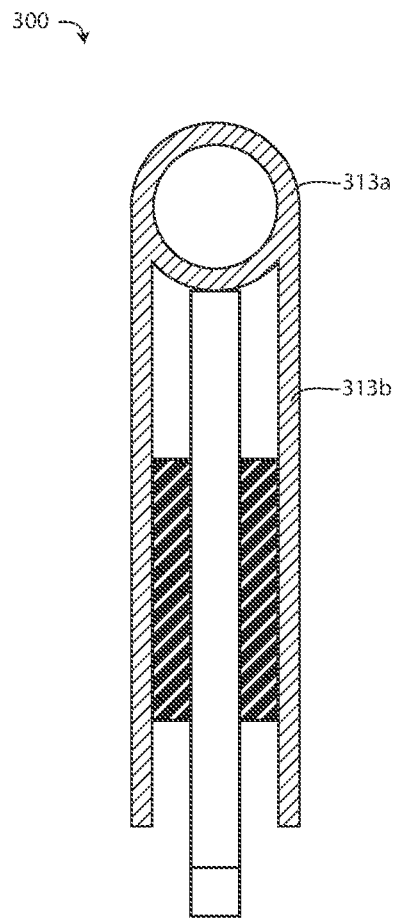
FIG. 3 is an end view of a memory modules including a tubular heat spreader in accordance with another embodiment of the present technology.

Although in the foregoing example embodiments, tubular heat spreaders have been illustrated and described with reference to rectilinear cross-sectional tubular portions, in other embodiments of the present technology, other tubular cross-sectional profiles may be used. For example, FIG. 3 illustrates a memory module 300 including a tubular heat spreader having a tubular portion 313a with an elliptical cross-section in accordance with another embodiment of the present technology. The tubular heat spread can further include integrated planar elements, such as planar element 313b, for providing a thermal path between the heat-generating elements of the memory module and the tubular portion 313a of the heat spreader.

Figure 4:
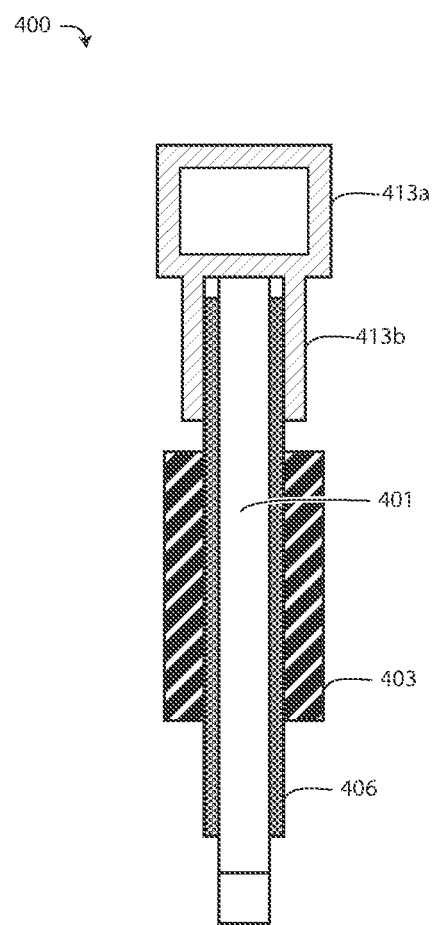
FIG. 4 is an end view of a memory module including a tubular heat spreader in accordance with an embodiment of the present technology.

Although in the foregoing example embodiments, tubular heat spreaders have been illustrated and described with planar elements for contacting heat-generating devices of a memory module, in other embodiments of the present technology, other approaches may be used to provide a thermal path between a heat-generating device on a memory module and a tubular heat spreader at an upper edge thereof. For example, FIG. 4 is an end view of a memory module including a tubular heat spreader in accordance with an embodiment of the present technology, in which the memory module includes an integrated heat-distribution layer 406 between the substrate 401 of the module and the heat-generating components (e.g., memory devices 403). The heat-distribution layer 406 may comprise a thermally conductive material (e.g., graphene, metal, or the like) in contact with the memory devices 403 and configured to convey thermal energy away from the memory devices to the tubular heat spreader. The tubular heat spreader includes a tubular portion 413a (e.g., with a rectilinear cross-sectional shape and open ends to permit the flow of a cooling gas) and planar elements 413b for providing a thermal connection between the heat-distribution layer 406 and the tubular portion 413a. The planar elements 413b can be integrated planar elements (e.g., as illustrated in FIG. 4), or alternatively may be provided by a shroud (e.g., as set forth in greater detail above) surrounding the tubular portion 413a and extending to the heat-distribution layer 406.

Although in the foregoing example embodiments, memory modules have been described and illustrated with respect to DIMMs, in other embodiments of the present technology, other memory module formats may also employ a tubular heat spreader as set forth in greater detail above. Moreover, although DIMMs have been described and illustrated with particular numbers of memory devices, and dedicated RCD dies, in other embodiments, other numbers of memory dies may be included, and RCD dies (and/or other integrated circuit dies, such as memory controllers, processors, etc.) may or may not be included in the memory modules.

Although in the foregoing example embodiments, memory modules have been described and illustrated with memory dies disposed on both sides thereof, in other embodiments, tubular heat spreaders may be provided on memory modules having integrated circuit dies on only one side. In such an embodiment, the tubular heat spreader may be thermally connected to the integrated circuit dies by a singular planar element, or via a thermally conductive layer internal to the module, or the like.

It should be noted that the methods described above describe possible implementations, and that the operations and the steps may be rearranged or otherwise modified and that other implementations are possible. Furthermore, embodiments from two or more of the methods may be combined.

Specific details of several embodiments of semiconductor devices are described herein. The term "semiconductor device" generally refers to a solid-state device that includes a semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
a printed circuit board (PCB) having an edge connector;
at least one integrated circuit device disposed on a surface of the PCB; and
a tubular heat spreader disposed along an edge of the PCB opposite the edge connector, wherein
the tubular heat spreader is configured to permit a flow of forced air through the tubular heat spreader,
the tubular heat spreader is attached to at least an edge of the PCB with solder connections that are thermally coupled to a plurality of memory devices of the at least one integrated circuit device, and
an attached combination of the tubular heat spreader and the PCB has a height that is less than an installation height within a server rack by a clearance distance representative of limited room for exposing heat exchanging structures to the flow of forced air.

2. The apparatus of claim 1, wherein the tubular heat spreader comprises a metal material.

3. The apparatus of claim 1, wherein the tubular heat spreader has a rectilinear tubular cross section.

4. The apparatus of claim 1, wherein the tubular heat spreader has an elliptical tubular cross section.

5. The apparatus of claim 1, wherein the tubular heat spreader is open at both ends thereof to permit the flow of a cooling gas through the tubular heat spreader.

6. The apparatus of claim 1, wherein a total height of the PCB and the tubular heat spreader is less than or equal to 31 mm.

7. The apparatus of claim 1, wherein the PCB has a height of less than 27 mm, wherein the height is measured between the edge and the edge of the PCB opposite the edge connector.

8. The apparatus of claim 1, further comprising a shroud surrounding the tubular heat spreader and contacting the at least one integrated circuit device, the shroud configured to convey thermal energy away from the at least one integrated circuit device.

9. The apparatus of claim 1, wherein the tubular heat spreader comprises at least one planar element contacting the at least one integrated circuit device and configured to convey thermal energy away from the at least one integrated circuit device.

10. The apparatus of claim 9, wherein the tubular heat spreader is attached to the PCB by a friction fit between the planar elements and the at least one integrated circuit device.

11. The apparatus of claim 1, wherein the tubular heat spreader is attached to the PCB with one or more solder connections.

12. The apparatus of claim 1, wherein the tubular heat spreader is attached to the PCB with an adhesive.

13. The apparatus of claim 1, wherein the apparatus is a dual in-line memory module (DIMM) and wherein the at least one integrated circuit device comprises a plurality of DRAM devices.

14. The apparatus of claim 1, wherein the solder connections provide the only thermal coupling connections between the at least one integrated circuit device and the tubular heat spreader.

15. The apparatus of claim 1, wherein the solder connections attach the tubular heat spreader directly to the PCB.

16. The apparatus of claim 1, wherein peripheral surfaces of the tubular heat spreader and the at least one integrated circuit device are configured to be exposed to the flow of forced air.

17. A circuit module, comprising:
a printed circuit board (PCB) having an edge connector;
a first plurality of integrated circuit devices disposed on a first surface of the PCB;
a second plurality of integrated circuit devices disposed on a second surface of the PCB; and
a tubular heat spreader disposed along an edge of the PCB opposite the edge connector, the tubular heat spreader having a thermal connection to the first and second pluralities of integrated circuit devices, wherein
the tubular heat spreader is configured to permit a flow of forced air through the tubular heat spreader,
the tubular heat spreader is attached to at least an edge of the PCB with solder connections that are thermally coupled to the first and/or second pluralities of integrated circuit devices, and
an attached combination of the tubular heat spreader and the PCB has a height that is less than an installation height within a server rack by a clearance distance representative of limited room for exposing heat exchanging structures to the flow of forced air.

18. The circuit module of claim 17, wherein the thermal connection comprises a shroud surrounding the tubular heat spreader and contacting the first and second pluralities of integrated circuit devices.

19. The circuit module of claim 17, wherein the thermal connection comprises first and second integrated planar elements, each extending from a tubular portion of the tubular heat spreader to a corresponding one of the first and second pluralities of integrated circuit devices.

20. The circuit module of claim 17, wherein the tubular heat spreader is open at both ends thereof to permit the flow of a cooling gas through the tubular heat spreader.

* * * * *